(12) United States Patent
Kudo et al.

(10) Patent No.: US 6,395,399 B2
(45) Date of Patent: May 28, 2002

(54) FLEXIBLE PRINTED SUBSTRATE

(75) Inventors: Noriaki Kudo; Minoru Nagashima, both of Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/730,805

(22) Filed: Dec. 7, 2000

(30) Foreign Application Priority Data

Dec. 20, 1999 (JP) .............................................. 11-361821

(51) Int. Cl.[7] ............................. B32B 15/08; H05K 1/03
(52) U.S. Cl. ..................... 428/458; 428/209; 428/473.5; 428/901; 528/183; 528/187; 528/220; 528/229; 528/341; 528/353
(58) Field of Search ................................. 528/183, 187, 528/220, 229, 341, 353; 428/209, 458, 473.5, 901

(56) References Cited

U.S. PATENT DOCUMENTS 5,599,582 A * 2/1997 Adamopoulos et al. .. 427/207.1
6,203,918 B1 * 3/2001 Shimose et al. ............ 428/458

FOREIGN PATENT DOCUMENTS

JP  60-157286  12/1999

* cited by examiner

*Primary Examiner*—D. S. Nakarani
(74) *Attorney, Agent, or Firm*—Oliff & Berridge, PLC

(57) ABSTRACT

A flexible printed substrate is constituted of metallic foil and provided thereon a polyimide layer which is produced by forming a film of a polyamic acid varnish on the metallic foil, followed by imidating. The polyimide layer has a linear expansion coefficient of $10 \times 10^{-6}$ to $30 \times 10^{-6}$ (1/K) and a softening point not more than the imidation temperature.

5 Claims, No Drawings

FLEXIBLE PRINTED SUBSTRATE

BACKGROUND OF THE INVENTION

1. Field of the Invention

The present invention pertains to flexible printed substrates with insulating layers and cover layers formed from a polyamic acid varnish.

2. Description of the Related Art

Flexible printed substrates, wherein as insulating layers or cover layers polyimide layers are formed directly on metallic foil such as copper foil without using an adhesive, are made by applying a polyamic acid varnish, which is obtained by addition-polymerization of an aromatic diamine such as para-phenylene diamine and an aromatic acid dianhydride such as pyromellitic dianhydride in a solvent such as N-methyl-2-pyrrolidone, to copper foil and drying to make a polyamic acid layer (polyimide precursor layer), followed by imidating this layer by heating to 300 to 400° C. to form a polyimide layer.

However, there is a problem in that residual stress is generated in conventional flexible printed substrates during film formation with the polyamic acid varnish and there is a difference in the linear expansion coefficient between the metallic foil (for instance, copper foil) and the polyimide layer and, therefore, the substrate curls.

Therefore, attempts have also been made to produce flexible printed substrates that do not curl by forming a polyimide layer with a low linear expansion coefficient using varnish containing polyamic acid with a specific structure (Japanese Patent Application Laid-Open No. Sho 60-157286).

Nevertheless, when a polyimide layer with a low linear expansion coefficient is formed using varnish containing polyamic acid with a specific structure, there are problems in that it cannot be said that the adhesive strength between the polyimide layer and metallic foil, such as copper foil, is sufficient, and when the copper foil is patterned by etching, the substrate curls to the copper foil side and as a result, there is a marked drop in productivity during subsequent finishing processes.

SUMMARY OF THE INVENTION

A object of the present invention is to solve the above-mentioned problems with prior art. Specifically it is to provide a flexible printed substrate having a polyimide layer with good adhesive strength to the metallic foil and with which there is no curling before or after etching of the metallic foil.

The present inventors completed the present invention upon discovering that the above-mentioned object can be accomplished by using a polyimide layer with a linear expansion coefficient within a specific range and a softening point not more than the imidation temperature as the polyimide layer of a flexible printed substrate in which this polyimide layer is provided as the insulating layer or cover layer on metallic foil.

That is, the present invention provides a flexible printed substrate, comprising metallic foil and provided thereon a polyimide layer which is produced by forming a film of a polyamic acid varnish on the metallic foil, followed by imidating, wherein the polyimide layer has a linear expansion coefficient of $10\times10^{-6}$ to $30\times10^{-6}$ (1/K) and a softening point not more than the imidation temperature.

DETAILED DESCRIPTION OF THE INVENTION

The flexible printed substrate of the present invention has a structure in which a polyimide layer is provided on metallic foil, the polyimide layer being formed by forming a film of a polyamic acid varnish, followed by imidating.

The polyimide layer of the present invention must have a linear expansion coefficient of $10\times10^{-6}$ to $30\times10^{-6}$ (1/K). As a result, the range of the linear expansion coefficient of the polyimide layer can correspond with the range of the linear expansion coefficient of the metallic foil and curling of the flexible printed substrate can be easily prevented. Taking into consideration the fact that the copper foil is generally used as the metallic foil, the linear expansion coefficient of the polyimide layer is preferably set at $18\times10^{-6}$ to $23\times10^{-6}$ (1/K).

Furthermore, the softening temperature of the polyimide layer must be not more than the imidation temperature upon imidation of a film of a polyamic acid varnish (usually 300 to 400° C., preferably 330 to 370° C.). As a result, residual stress upon film formation of the polyamic acid varnish can be alleviated.

Determination of the "linear expansion coefficient" and "softening point" of the polyimide layer in the present invention can be performed using a thermomechanical analyzer (TMA, Seiko Denshi Co., Ltd.) For instance, TMA properties are determined within a temperature range of 30° C. to 400° C. under conditions of a temperature elevation speed of 5° C./minute in tensile mode under a 5 g load using a polyimide film with a thickness of 20 μm, width of 4 mm, and length of 20 mm as the sample, and the linear expansion coefficient can be found from the TMA curve that has been obtained. Moreover, it is possible to extend the almost straight part of the TMA curve on the low-temperature side to the high-temperature side and extend the tangent of the part of the curve, where at the part the changing rate of the TMA curve is increased due to softening, to the low-temperature side and find the point of intersection between these extensions as the "softening point" (in accordance with the method of finding needle temperature of JIS K7196).

Examples of a specific measure for obtaining a polyimide film having a linear expansion coefficient of $10\times10^{-6}$ to $30\times10^{-6}$ (1/K) and a softening point not more than the imidation temperature includes a measure in which imidazolyl-diamino azine is externally added to a polyamic acid varnish used for the formation of polyimide layers (that is, a mixture containing polyamic acid obtained by addition polymerization of aromatic diamine and aromatic acid dianhydride in a solvent); and a measure in which the the types and mixture ratios of the aromatic diamine component and aromatic acid dianhydride component constituting the polyamic acid are selected. These two measures can also be combined.

Those represented by general formula (1)

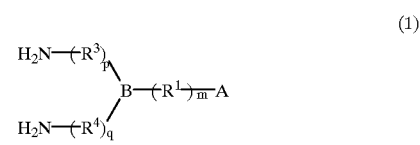

(where A is an imidazolyl group represented by formula (1a), (1b), or (1c)

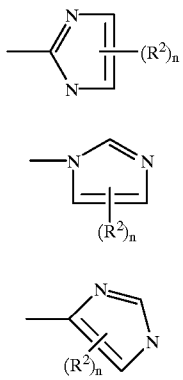

R¹ is an alkylene group and m is 0 or 1. R² is an alkyl group and n is 0, 1 or 2. R³ and R⁴ are alkylene groups and p and q are each 0 or 1. B is an azine residue, diazine residue, or triazine residue.) are given as examples of imidazolyl-diamino azines that can be used in the present invention.

Furthermore, when m is 0 in the imidazolyl-diamino azine of formula (1), the alkylene group of R¹ is not present and the azine residue, diazine residue or traizine residue is directly bonded to the imidazole ring. Methylene, ethylene, propylene and the like can be given as examples of alkylene groups of R¹ when m is 1.

When n is 0, the alkyl group of R² is not present and the hydrogen atom is bonded with the imidazole ring. Methyl, ethyl, can be given as examples of alkyl groups of R² when n is 1. Two R² groups are bonded to the imidazole ring when n is 2 and methyl, ethyl and the like can be given independently as examples of alkyl groups of each R². Furthermore, depending on the case, R² may also be directly bonded with the nitrogen atoms of the imidazole ring.

When p is 0, the alkylene group of R³ is not present and the amino group is bonded directly with the azine residue, diazine residue, or triazine residue. Methylene, ethylene and the like can be given as examples of the alkylene group of R³ when p is 1.

When q is 0, the alkylene group of R⁴ is not present and the amino group is directly bonded to the azine residue, diazine residue, or triazine residue. Methylene, ethylene and the like can be given as examples of the alkylene group of R⁴ when q is 1.

B is an azine residue, diazine residue or triazine residue. Of these, diamines with triazine residues are preferred because they can be easily synthesized or easily procured industrially.

The following compounds where both p and q are 0 can be given as preferred specific examples of the imidazolyl-diamino azines of formula (1):
2,4-diamino-6-[2-(2-methyl-1-imidazolyl)ethyl]-s-triazine;
2,4-diamino-6-[2-(2-ethyl-1-imidazolyl)ethyl]-s-triazine;
2,4-diamino-6-[1-(2-undecyl-1-imidazolyl)ethyl]-s-triazine;
2,4-diamino-6-[2-(2-imidazolyl)ethyl]-s-triazine;
2,4-diamino-6-[2-(1-imidazolyl)ethyl]-s-triazine;
2,4-diamino-6-(2-ethyl-4-imidazolyl)-s-triazine;
2,4-diamino-6-[2-(4-methyl-1-imidazolyl)ethyl]-s-triazine;
2,4-diamino-6-(2-ethyl-5-methyl-4-imidazolyl)-s-triazine;
2,4-diamino-6-(4-ethyl-2-methyl-1-imidazolyl)-s-triazine;
2,4-diamino-6-[3-(2-methyl-1-imidazolyl)propyl]-s-triazine;
2,4-diamino-6-[4-(2-imidazolyl)butyl]-s-triazine;
2,4-diamino-6-[2-(2-methyl-1-imidazolyl)propyl]-s-triazine;
2,4-diamino-6-[1-methyl-2-(2-methyl-1-imidazolyl)ethyl]-s-triazine;
2,4-diamino-6-[2-(2,5-dimethyl-1-imidazolyl)ethyl]-s-triazine;
2,4-diamino-6-[2-(2,4-dimethyl-1-imidazolyl)ethyl]-s-triazine; or
2,4-diamino-6-[2-(2-ethyl-4-methyl-1-imidazolyl)ethyl]-s-triazine.

Of these, the following compounds are preferred:
2,4-diamino-6-[2(2-ethyl-4-methyl-1-imidazolyl)ethyl]-s-triazine;
2,4-diamino-6-[2-(2-methyl-1-imidazolyl)ethyl]-s-triazine; or
2,4-diamino-6-[1-(2-undecyl-1-imidazolyl)ethyl]-s-triazine.

If the amount of imidazolyl-diamino azine of formula (1) mixed in the polyamic acid varnish is too little or too much, the adhesive strength of the polyimide layer will be insufficient, while if it is too much, there will be a reduction in mechanical strength and heat resistance. Therefore, it should be preferably 0.1 to 10 parts by weight, more preferably 0.1 to 5 parts by weight, per 100 parts by weight polyamic acid, which is the solid content.

Conventionally, well known aromatic diamine components can be used as the aromatic diamine component of the polyamic acid. Aromatic diamines selected from 4,4'-diaminophenyl ether, para-phenylene diamine, 4,4'-diaminobenzanilide, 4,4'-bis(p-aminophenoxy) diphenylsulfone and 2,2-bis[4-(4-aminophenoxy)phenyl propane can be given as preferred examples.

Furthermore, of these aromatic diamines, simultaneous use of para-phenylene diamine is preferred in order to reduce thermoexpansivity of the polyimide. Moreover, simultaneous use of 4,4-diaminodiphenyl ether is preferred in order to increase thermoexpansivity of the polyimide.

Moreover, conventionally well-known aromatic acid dianhydrides can be used as the aromatic acid dianhydride for the polyamic acid. For instance, aromatic dianhydrides selected from pyromellitic dianhydride (PMDA), 3,4,3',4'-biphenyl tetracarboxylic dianhydride (BPDA), 3,4,3',4'-benzophenonetetracarboxylic dianhydride (BTDA), or 3,4, 3',4'-diphenylsulfonetetracarboxylic dianhydride (DSDA) can be given as preferred examples.

Although the percentages of aromatic diamine component and aromatic acid dianhydride component constituting the polyamic acid can be such that there is excess aromatic diamine or excess aromatic acid dianhydride, it is preferred that they are used at the equimolar ratio.

A solvent that is conventionally used for a polyamic acid varnish can be used as the solvent in the polyamic acid varnish, and N-methyl-2-pyrrolidone can be given as a preferred example.

There are no particular restrictions to the amount of solvent that is used and it can be set as needed in accordance with viscosity of the polyamic acid varnish.

Conventionally well-known additives may be mixed as needed in accordance with the polyamic acid varnish used by the present invention.

Furthermore, although there are no particular restrictions to the thickness of the polyimide layer that is used, it is normally 10 to 50 μm.

Moreover, various metallic foils can be used as the metallic foil for the flexible printed substrate of the present invention, and aluminum foil, copper foil, gold foil, are preferred. Mat treatment, plating treatment, aluminum alcoholate treatment, aluminum chelate treatment, silane coupling agent treatment, can be performed on these metallic foils as needed.

There are no particular restrictions to thickness of the metallic foil, but it is normally 5 to 35 μm.

The flexible printed substrate of the present invention can be produced as described below:

First, aromatic diamine and aromatic acid dianhydride are addition-polymerized in a solvent. The conditions of addition-polymerization can be set as needed in accordance with the conditions of conventional addition-polymerization of polyamic acid. Specifically, the aromatic diamine is first heated and dissolved in a solvent (for instance, N-methyl-2-pyrrolidone) and acid dianhydride is gradually added at 0 to 90° C., preferably 5 to 50° C., under an inert ambient atmosphere, such as nitrogen gas. Then addition-polymerization is performed for several hours. As a result, polyamic acid is obtained in a state of dissolution in a solvent. The polyamic acid varnish is obtained by adding imidazolyl-diamino azine of formula (1) to this solution and mixing to dissolution.

Next, the a polyamic acid varnish to which imidazolyl-diamino azine has been externally added is applied to the metallic foil using a comma coater, and dried to obtain a polyamic acid layer as the polyimide precursor layer. Upon the drying, it is preferable that a residual volatile amount in the polyamic acid film (content of "remaining solvent undried and water generated upon by imidation") is 70% or less so that foaming will not occur during imidation of the following process.

Imidation of the polyamic acid layer that has been obtained is performed by heating to 300 to 400° C. under an inert ambient atmosphere (for instance, nitrogen ambient atmosphere) to form the polyimide layer. As a result, a flexible printed substrate is obtained, Incidentally, it appears that the imidazolyl-diamino azine that has been externally added reacts with the polyamic acid and part [of this] is taken up inside the polyimide molecules.

The flexible printed substrate obtained in this way has good adhesive strength between the metallic foil (copper foil) and polyimide layer. Moreover, curling will not occur before and after etching of the metallic foil. In addition, imidazol residues that show rust-proofing effects are present in the polyimide layer and therefore, no corrosion or discoloration of the surface (surface where polyimide is formed) of the metallic foil, such as copper foil, and no electric migration by copper ions, even when the flexible printed substrate is a circuit board, can be expected.

EXAMPLES

The present invention will be explained in specific terms below:

Example 1 and Comparative Examples 1~2

First, in a 5 liter reaction vessel with a jacket, 83.3 g (0.77 mole) para-phenylene diamine (PDA, Daishin Kasei Co., Ltd.) and 46.0 g (0.23 mole) 4,4'-diaminodiphenyl ether (DPE, Wakayama Seika Co., Ltd.) were dissolved in approximately 3 kg solvent N-methyl-2-pyrrolidone (NMP, Mitsubishi Kagaku Co., Ltd.) under a nitrogen gas ambient atmosphere and kept at 50° C. Then they were reacted for 3 hours as 297.1 g (1.01 moles) 3,4,3',4'-biphenyl tetracarboxylic dianhydride (BPDA, Mitsubishi Kagaku Co., Ltd.) were gradually added.

Next, in the polyamic acid solution thus obtained, 21.3 g (5 parts by weight per 100 parts by weight polyamic acid) 2,4-diamino-6-[2-(2-ethyl-4-methyl-1-imidazolyl)ether]-s-triazine were added and dissolved as the imidazolyl-diamino azine of formula (1) to obtain a polyamic acid varnish.

The same polyamic acid varnish as in comparative Examples 1 and 2 were obtained by repeating the same procedure as in Example 1, with the exception that imidazolyl-diamino azine was not used.

Furthermore, the compounds in Table 1 are listed below:

(Aromatic acid dianhydride)

BPDA: 3,4,3',4'-biphenyl tetracarboxylic dianhydride

PMDA: pyromellitic dianhydride (Aromatic diamine)

PDA: para-phenylene diamine

DPE: 4,4'-diaminodiphenyl ether

TABLE 1

|  | Example | Comparative Example | |
|---|---|---|---|
|  | 1 | 1 | 2 |
| Acid dianhydride | BPDA | PMDA | PMDA |
| Diamine (a) | PDA | PDA | PDA |
| (b) | DPE | DPE | DABA |
| Molar ratio (a)/(b) | 75/25 | 75/25 | 50/50 |
| Compound of formula (1) | 2.5 wt parts | — | — |

Next, the above-mentioned polyamic acid varnishes were applied to a roughed surface of a copper foil (Furukawa Circuit Foil Co., Ltd.) and dried step by step so that foaming would not occur. Then imidation was performed under a nitrogen gas ambient temperature of 350° C. (15 minutes) to obtain a flexible printed substrate having a polyimide layer with a thickness of 25 μm. Peeling strength (kg/cm) was determined as the adhesive strength at 23° C. of the polyimide layer of the flexible printed substrate that was obtained in accordance with JIS C6471 (peeled at a width of 1.59 mm and at a 90° angle). The results thus obtained are shown in Table 2.

Determination of the "linear expansion coefficient" and "softening point" in the polyimide layer of the present invention was from the TMA curve, which is the result of determining TMA properties under conditions of a temperature elevation speed of 5° C./minute within a temperature range of 30° C. to 400° C. in tensile mode under a 5 g load using a thermomechanical analyzer (TMA, Seiko Denshi Co., Ltd.) and a polyimide film with a thickness of 20 μm, width of 4 mm, and length of 20 mm. The linear expansion coefficient and softening point are shown in Table 2.

In addition, the entire surface of the copper foil of the flexible printed substrate that was made in the same way was etched with cuprous chloride etching solution to obtain polyimide film only and the curled status of the flexible printed substrate before etching and the polyimide film obtained after etching was investigated. Specifically, the flexible printed substrate and polyimide film were placed on a flat plate under conditions of 23° C. and 60% Rh, and average distance between the surface of the flat plane and each of four corners of the surface of the films was determined. The results are shown in Table 2.

TABLE 2

|  | Example | Comparative Example | |
| --- | --- | --- | --- |
|  | 1 | 1 | 2 |
| Adhesive strength (kg/cm) | 1.43 | 0.74 | 0.82 |
| Linear expansion coefficient ($\times 10^{-6}$ (1/K)) | 21 | 35 | 24 |
| Softening point (° C.) | 310–320 | 350–360 | <400 |
| Curling: (mm) |  |  |  |
| Substrate | 4.0 | Tubular curling | Tubular curling |
| Film | 0.75 | Tubular curling | Tubular curling |

From the results in Table 2, the flexible printed substrate having a polyimide layer formed from a polyamic acid varnish containing a specific imidazolyl-diamino azine as external additive (Example 1) has a linear expansion coefficient of the polyimide layer of $21\times 10^{-6}$ (1/K), which is within the range of $10\times 10^{-6}$ to $30\times 10^{-6}$ (1/k) and it begins to show a softening point at 310 to 320° C., which is less than the imidation temperature (400° C.). Therefore, it is clear that it has good adhesive strength between the polyimide layer and copper foil and there is very little curling before and after etching.

On the other hand, the flexible printed substrates having a polyimide layer formed from a polyamic acid varnish that did not contain a specific imidazolyl-diamino azine as external additive (Comparative Examples 1 and 2) either had a linear expansion coefficient of the polyamide layer outside the range of $10\times 10^{-6}$ to $30\times 10^{-6}$ (1/K) or a softening point more than the imidation temperature (400° C.), and therefore, adhesive strength between the polyimide layer and copper foil was poor and there was remarkable curling before and after etching.

The flexible printed substrate of the present invention shows good adhesive strength of its polyimide layer to the metallic foil and curling before and after etching is kept to a level that does not pose a problem in terms of practical use.

The entire disclosure of the specification, claims and abstract of Japanese Patent Application No. 11-361821 filed Dec. 20, 1999 is hereby incorporated by reference.

What is claimed is:

1. A flexible printed subtrate, comprising metallic foil and provided thereon a polyimide layer which is produced by forming a film of a polyamic acid varnish on the metallic foil, followed by imidating, wherein the polyimide layer has a linear expansion coefficient of $10\times 10^{-6}$ to $30\times 10^{-6}$ (1/K) and a softening point not more than the imidation temperature; and wherein the polyimide layer is formed from the polyamic acid varnish to which imidazolyl-diamino azine has been externally added.

2. The flexible printed substrate according to claim 1, wherein the metallic foil is copper foil and the linear expansion coefficient of the polyimide layer is $18\times 10^{-6}$ to $23\times 10^{-6}$ (1/K).

3. The flexible printed substrate according to claim 1, wherein the imidation temperature is 300 to 400° C.

4. The flexible printed substrate according to claim 1, wherein the imidazolyl-diamino azine is selected from the group consisting of:

2,4-diamino-6-(2-(2-methyl-1-imidazolyl)ethyl)-s-triazine;

2,4-diamino-6-(2-(2-ethyl-1-imidazolyl)ethyl)-s-triazine;

2,4-diamino-6-(1-(2-undecyl-1-imidazolyl)ethyl-s-triazine;

2,4-diamino-6-(2-(2-imidazolyl)ethyl)-s-triazine;

2,4-diamino-6-(2-(1-imidazolyl)ethyl)-s-triazine;

2,4-diamino-6-(2-ethyl-4-imidazolyl)-s-triazine;

2,4-diamino-6-(2-(4-methyl-1-imidazolyl)ethyl)-s-triazine;

2,4-diamino-6-(2-ethyl-5-methyl-4-imidazolyl)-s-triazine;

2,4-diamino-6-(4-ethyl-2-methyl-1-imidazolyl)-s-triazine;

2,4-diamino-6-(3-(2-methyl-1-imidazolyl)propyl)-s-triazine;

2,4-diamino-6-[4-(2-imidazolyl)butyl]-s-triazine;

2,4-diamino-6-[2-(2-methyl-1-imidazolyl)propyl]-s-triazine;

2,4-diamino-6-[1-methyl-2-(2-methyl-1-imidazolyl)ethyl]-s-triazine;

2,4-diamino-6-[2-(2,5-dimethyl-1-imidazolyl)ethyl]-s-triazine;

2,4-diamino-6-[2-(2,4-dimethyl-1-imidazolyl)ethyl]-s-triazine; and 2,4-diamino-6-[2-(2-ethyl-4-methyl-1-imidazolyl)ethyl]-s-triazine.

5. The flexible printed substrate according to claim 1, wherein the imidazolyl-diamino azine is used in an amount of 0.1 to 10 parts by weight per 100 parts by weight polyamic acid.

* * * * *